United States Patent [19]
Wang et al.

[11] Patent Number: 5,703,388
[45] Date of Patent: Dec. 30, 1997

[54] DOUBLE-POLY MONOS FLASH EEPROM CELL

[75] Inventors: Chih-Hsien Wang; Min-Liang Chen, both of Hsin-Chu; Thomas Chang, Taichung, all of Taiwan

[73] Assignee: Mosel Vitelic Inc., Hsinchu, Taiwan

[21] Appl. No.: 684,517

[22] Filed: Jul. 19, 1996

[51] Int. Cl.$^6$ ............... H01L 29/788; H01L 29/76
[52] U.S. Cl. ............... 257/315; 257/316; 257/317; 257/319; 257/321; 257/34; 257/52
[58] Field of Search ............... 257/316, 317, 257/321, 315; 437/34, 52

[56] References Cited

U.S. PATENT DOCUMENTS

| | | | |
|---|---|---|---|
| 4,964,080 | 10/1990 | Tzeng | 365/185 |
| 5,326,999 | 7/1994 | Kim et al. | 257/315 |
| 5,338,952 | 8/1994 | Yamauchi | 257/315 |
| 5,541,130 | 7/1996 | Ogura et al. | 437/43 |

*Primary Examiner*—Valencia Martin Wallace
*Attorney, Agent, or Firm*—Christensen O'Connor Johnson & Kindness PLLC

[57] ABSTRACT

The present invention discloses a double poly metal oxide\nitride\oxide semiconductor electrically erasable programmable read only memory (EEPROM) for use in semiconductor memories. The EEPROM structure includes a select gate, an oxide\nitride\oxide layer, and a control gate. The control gate is formed on the oxide\nitride\oxide layer. A lightly doped drain (LDD) structure is formed adjacent to the drain and underneath the control gate.

6 Claims, 3 Drawing Sheets

DOUBLE-POLY MONOS FLASH EEPROM CELL

FIELD OF THE INVENTION

The present invention relates to an electrically erasable programmable read only memory (EEPROM), and more particularly, to a double-poly MONOS flash EEPROM cell.

BACKGROUND OF THE INVENTION

The electrically erasable programmable read only memory (EEPROM) market has divided for historical reasons into four fairly distinct product segments. These include the EAROM, EEPROM, EEPROM-EAROMs and non-volatile SRAMs. Different types of devices have been developed for specific applications requirements in each of these segments. The low density (below 8 k) EAROMs have been used in such applications as consumer radio tuners, automotive engine controllers, etc. Medium density EEPROMs have been required by microprocessor based applications such as distributed systems or changeable program store. These parts have been developed with a focus on the high endurance and high speed requirements.

The four basic technologies used to manufacture electrically reprogrammable ROMs all utilize to some extent Fowler-Nordheim tunneling which is cold electron tunneling through the energy barrier at a silicon-silicon dioxide interface and into the oxide conduction band. The earliest electrically reprogrammable ROM process in the early 1970s utilized a metal-nitride-oxide silicon combination (MNOS) for the gate region of a P-channel storage cell producing devices called EAROMs (electrically alterable ROMs). The thin silicon dioxide layer allows charges to tunnel through when a voltage is applied to the gate. These charges are trapped in the silicon dioxide to silicon nitride interface and remain trapped there since the materials are high quality insulators. A double polysilicon process is used in a cell consisting of a MNOS transistor and a select transistor.

For programming, a negative voltage is applied to the source and drain while the substrate and gate are grounded. The potential at the central portion of the channel became almost the same as that of the drain and source so that tunneling electrons move from the silicon to the nitride through the thin oxide layer and the electrons are trapped in the nitride. This made the threshold of the MNOS transistor shift in the positive direction so that it conducted more difficult. In the mode of erasing, electrons are emitted from the traps in the nitride by applying a negative voltage to the gate electrode while the source and the drain are grounded.

SUMMARY OF THE INVENTION

A double-poly MONOS EEPROM formed on a semiconductor substrate is disclosed. The EEPROM comprises a source formed in said substrate, a drain formed in said substrate, a gate oxide layer formed on said semiconductor substrate adjacent to said source and spaced apart from said drain by a spacing width, a select gate formed on said gate oxide layer, a dielectric layer formed on a portion of said select gate, a portion of said drain, and said spacing width, said dielectric layer used to store electrons, and a control gate formed on said dielectric layer, said control gate used to control the mode of said EEPROM.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
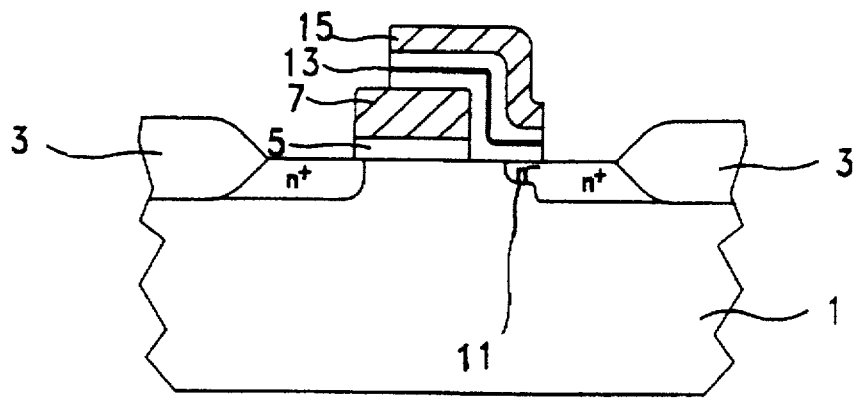
FIG. 1 is a cross section view of a semiconductor wafer illustrating the structure of an EEPROM formed in accordance with the present invention.

A double-poly MONOS (metal oxide\nitride\oxide semiconductor) flash electrically erasable programmable read only memory (EEPROM) is disclosed. As seen in FIG. 1, the EEPROM device comprises source and drain regions (denoted by $n^+$) that are formed in the substrate of a semiconductor wafer 1. A lightly doped drain (LDD) structure 11 is formed adjacent to the drain for the purpose of reducing hot carriers near the drain junction. A silicon dioxide layer 5 is formed between the source and the lightly doped drain 11. Because silicon dioxide layer 5 serves as a gate oxide 5, it will be referred to as such.

A polysilicon select gate 7 is formed on the silicon dioxide layer 5 by the deposition of polysilicon. The length of the select gate 7 is shorter than the length of the channel between the source and the lightly doped drain 11, and therefore, the select gate 7 does not abut against lightly doped drain 11. A triple composition layer 13 is then formed on the select gate 7 and the source, lightly doped drain 11, and drain. The composition layer 13 is composed of oxide\nitride\oxide (O\N\O). By conventional masking and etching, the O\N\O layer 13 is made to extend over a portion of the select gate 7, the uncovered portion of the channel, and the lightly doped drain 11. A control gate 15 of polysilicon is then formed on the O\N\NO layer 13.

In the programming mode, hot carriers tunnel from the channel to the O\N\O layer 13 and are trapped in the O\N\O layer 13. In order to accomplish this, the control gate, the select gate and the drain are positively biased while the source is ground.

In the erase mode, carriers tunnel from the O\N\O layer to the drain. In the erasure mode the drain is at the high voltage while the select gate is off so that there are no electrons flowing into the channel from the source. The select gate serves to conserve power because the device is erased without causing current to flow through the channel of the device. In addition, the cell of the present invention is better suited to military applications, because it is hardened against radiation. The cell also can operate with a relatively thick tunneling oxide. This provides greater data retention. Further, the cell requires relatively low voltage operation.

The formation of the double poly electrically erasable programmable read only memory (EEPROM) described herein includes many process steps that are well known in the art. For example, the process of photolithography masking and etching is used extensively herein. This process consists of creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photoresist. This photolithography masking and etching process is referred to as "patterning and etching."

Figure 2:
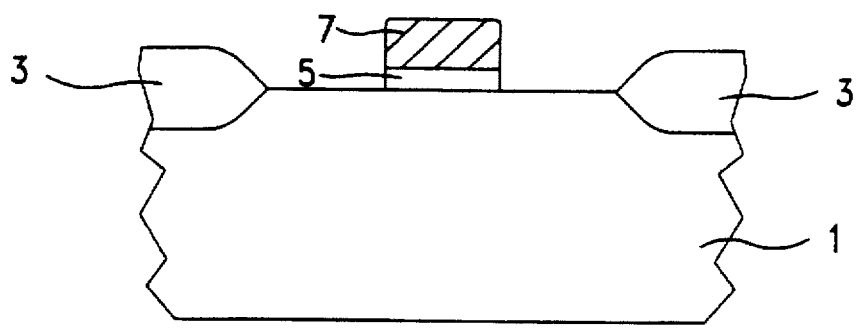
FIG. 2 is a cross section view of a semiconductor wafer illustrating the formation of a select gate and gate oxide.

As will be seen below, this technique can be used to form a double-poly MONOS EEPROM of the present invention. Referring to FIG. 2, in the preferred embodiment, a silicon wafer is provided that is a single crystal substrate 1. The single crystal substrate 1 is P-type with a <100> crystallographic orientation.

First, a thick field oxide region (FOX) 3 is created for purposes of isolation. The FOX 3 region is created via photolithography and dry etching steps to etch a silicon nitride-silicon dioxide composite layer. After the photoresist is removed, and wet cleaned, a thermal oxidation in an oxygen steam ambient is used to form the FOX 3 region, at a thickness about 4000–6000 angstroms.

Next, a first silicon dioxide layer 5 is formed on the substrate 1 to act as the gate oxide 5. The first silicon dioxide layer is formed by using an oxygen-steam ambient, at a temperature between about 850° to 1000° C., to a thickness about 140 angstroms.

Next, a first polysilicon layer 7 is formed over the first silicon dioxide layer 5, silicon substrate 1, and field oxide regions 3. Next, a patterning and etching step is used to etch the first polysilicon layer and first silicon dioxide layer to form a gate oxide 5 and select gate 7 as shown in FIG. 2. The first polysilicon layer is formed using conventional chemical vapor deposition (CVD). It can be appreciated that other methods of depositing the first polysilicon layer can also be used. The thickness of the first polysilicon layer is optimally 2000 angstroms, and the first polysilicon layer is chosen from doped polysilicon or in-situ doped polysilicon.

Figure 3:
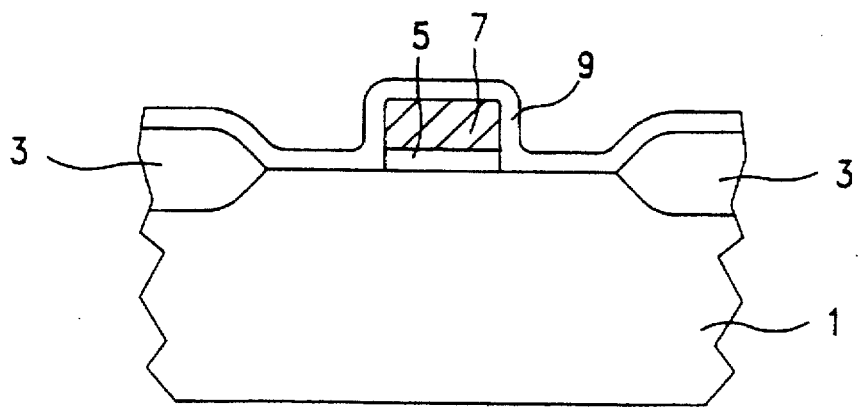
FIG. 3 is a cross section view of a semiconductor wafer illustrating the formation of a silicondioxide layer on the select gate and on the substrate.
Figure 4:
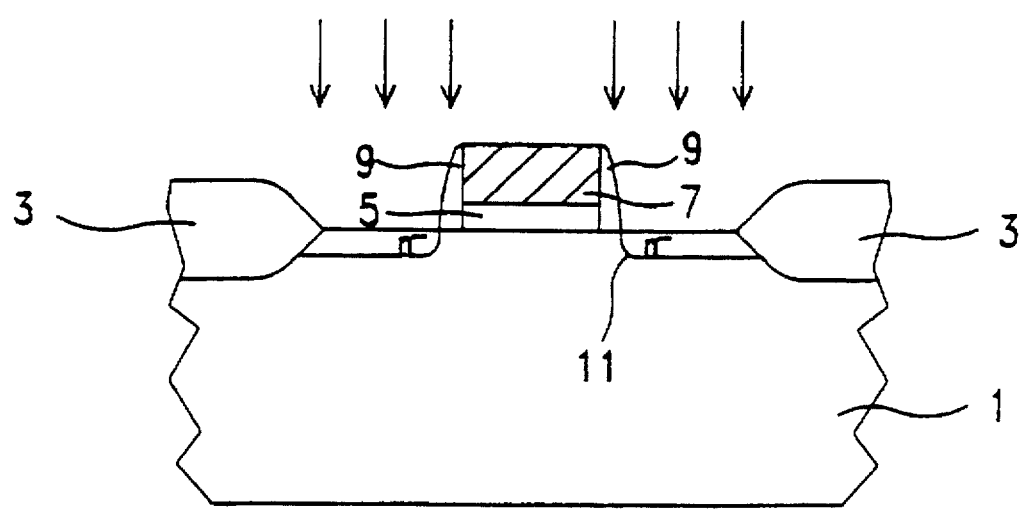
FIG. 4 is a cross section view of a semiconductor wafer illustrating the step of forming a lightly doped drain.

Referring next to FIG. 3, a second silicon dioxide layer 9 is formed on the select gate 7, field oxide 3 and on the substrate 1. Then, an anisotropic etching process is performed to etch the second polysilicon layer 9 to form side wall spacers 9 as shown in FIG. 4. In the preferred embodiment, the ion source of the etching is oxygen. Next, an ion implantation is performed to create the lightly doped drain (LDD) 11. The dosage of the implantation is 2E13. After the lightly doped drain 11 is formed, the side wall spacers 9 are removed by using wet etching.

Figure 5:
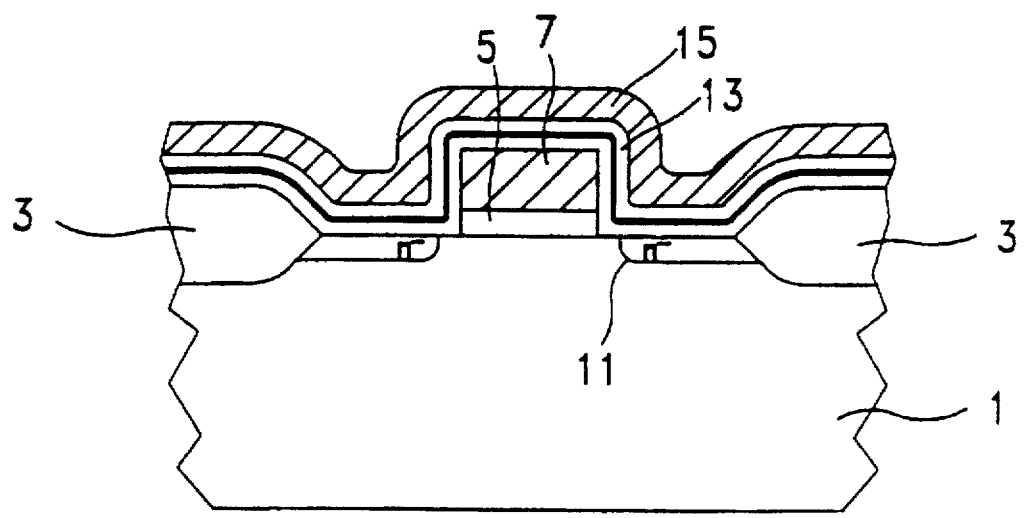
FIG. 5 is a cross section view of a semiconductor wafer illustrating the step of forming a oxide\nitride\oxide layer and polysilicon layer on the select gate substrate.
Figure 6:
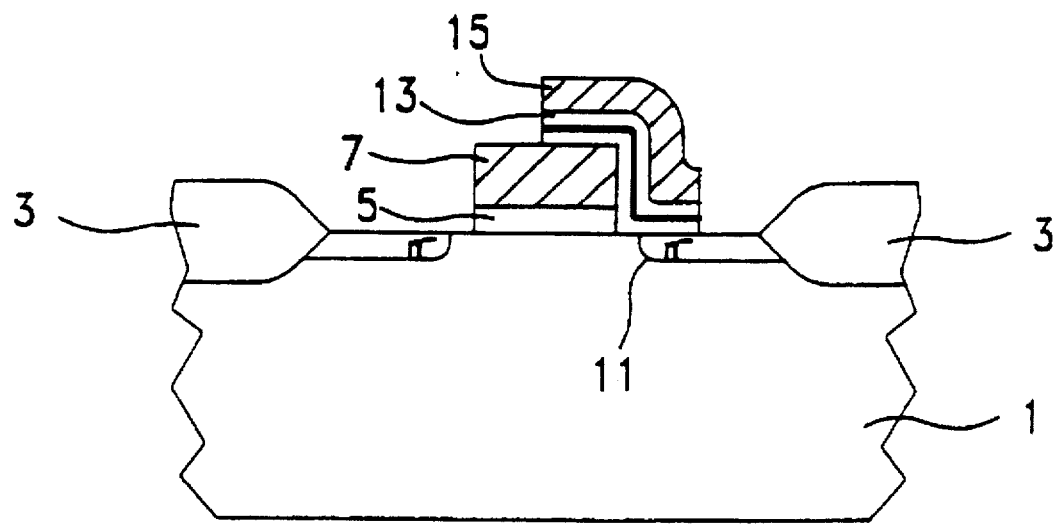
FIG. 6 is a cross section view of a semiconductor wafer illustrating the step of forming a control gate.

Now turning to FIG. 5, a dielectric triple composition layer 13 is formed on the select gate 7. The dielectric layer 13 is composed of three separate layers of oxide, nitride, and oxide. The thickness of the O\N\O layer 13 is about 300 angstroms. Subsequently, a second polysilicon layer 15 is formed on the O\N\O layer 13 to a thickness about 200–300 angstroms. The second polysilicon layer 15 is used for forming a control gate and therefore will be referred to as such. Next, a patterning and etching step is used to etch the second polysilicon layer 15 and the O\N\O layer 13 to the structure of FIG. 6. As seen, the control gate 15 and the triple composition layer 13 cover a portion of the select gate, the uncovered portion of the channel, and the lightly doped drain 11.

Figure 7:
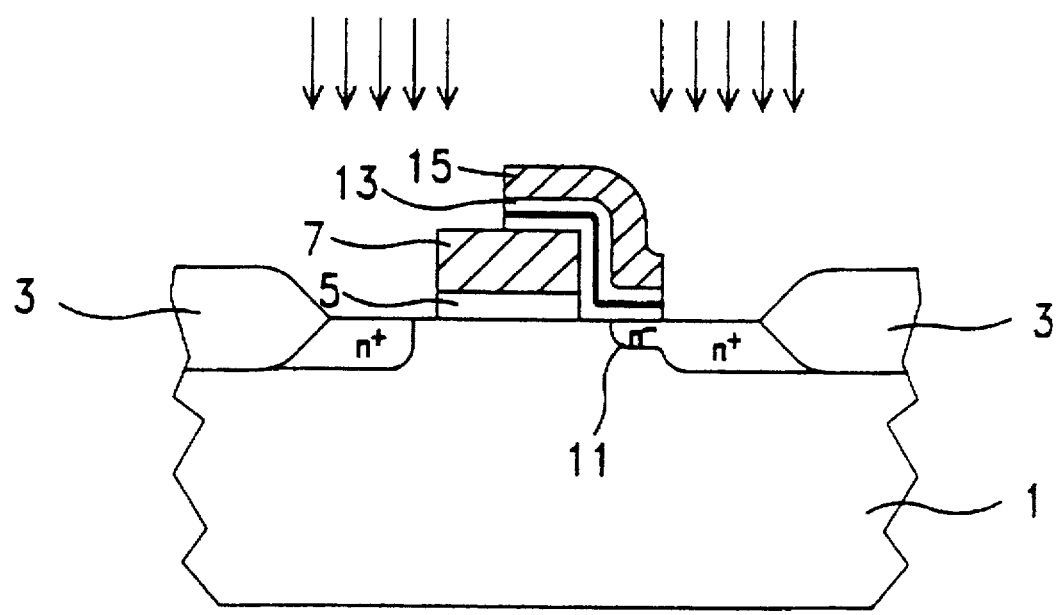
FIG. 7 is a cross section view of a semiconductor wafer illustrating the step of forming a heavily doped source and drain.

Next, as seen in FIG. 7, an ion implantation step is applied to form the heavy doped source and drain. In addition, a rapid thermal process is performed to drive the ions into the substrate 1. Thus, an EEPROM as shown in FIG. 1 is formed.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A double-poly MONOS EEPROM formed on a semiconductor substrate, said EEPROM comprising:
   a source formed in said substrate;
   a drain formed in said substrate;
   a gate oxide layer formed on said semiconductor substrate adjacent to said source and drain, said gate oxide layer being spaced apart from said drain by a first spacing width, said gate oxide layer being spaced apart from said source by a second spacing width;
   a select gate formed on said gate oxide layer;
   a dielectric layer formed on a portion of said select gate, a portion of said drain, and said first spacing width, said second spacing width being exposed by said select gate and said dielectric layer, said dielectric layer used to store carriers, said carriers tunneling into said dielectric layer via said first spacing width in a programming mode, wherein said select gate is used for conserving power in an erase mode; and
   a control gate formed on said dielectric layer.

2. The EEPROM of claim 1, wherein said dielectric layer is a triple composition layer that is comprised of oxide\nitride\oxide layers.

3. The EEPROM of claim 1, wherein said select gate is formed of polysilicon.

4. The EEPROM of claim 1, wherein said gate oxide layer is formed of silicon dioxide.

5. The EEPROM of claim 1, wherein said control gate is formed of polysilicon.

6. The EEPROM of claim 1 wherein said drain includes a lightly doped drain aligned with and under a portion of said control gate.

* * * * *